United States Patent [19]
Gardner et al.

[11] Patent Number: 5,877,050
[45] Date of Patent: Mar. 2, 1999

[54] METHOD OF MAKING N-CHANNEL AND P-CHANNEL DEVICES USING TWO TUBE ANNEALS AND TWO RAPID THERMAL ANNEALS

[75] Inventors: Mark I. Gardner, Cedar Creek; Derick J. Wristers; H. Jim Fulford, Jr., both of Austin, all of Tex.

[73] Assignee: Advanced Micro Devices, Inc., Sunnyvale, Calif.

[21] Appl. No.: 711,956

[22] Filed: Sep. 3, 1996

[51] Int. Cl.⁶ .................................................. H01L 21/8238
[52] U.S. Cl. .......................... 438/231; 438/232; 438/286; 438/308
[58] Field of Search .................................... 438/232, 231, 438/229, 230, 223, 227, 308, 407, 286; 148/DIG. 3, DIG. 4

[56] References Cited

U.S. PATENT DOCUMENTS

| | | | |
|---|---|---|---|
| 4,225,875 | 9/1980 | Ipri | 257/353 |
| 4,272,881 | 6/1981 | Angle | 438/284 |
| 4,575,920 | 3/1986 | Tsunashima | 438/297 |
| 4,927,777 | 5/1990 | Hsu et al. | 438/305 |
| 4,956,311 | 9/1990 | Liou et al. | 438/231 |
| 5,073,514 | 12/1991 | Ito et al. | 438/305 |
| 5,132,753 | 7/1992 | Chang et al. | 257/655 |
| 5,169,796 | 12/1992 | Murray et al. | 438/232 |
| 5,171,700 | 12/1992 | Zamanian | 438/305 |
| 5,200,358 | 4/1993 | Bollinger et al. | 438/286 |
| 5,215,936 | 6/1993 | Kinugawa | 438/305 |
| 5,286,664 | 2/1994 | Horiuchi | 438/286 |
| 5,296,398 | 3/1994 | Noda | 438/179 |
| 5,349,225 | 9/1994 | Redwine et al. | 257/336 |
| 5,364,807 | 11/1994 | Hwang | 438/286 |
| 5,366,915 | 11/1994 | Kadama | 438/257 |
| 5,397,715 | 3/1995 | Miller | 438/268 |
| 5,424,229 | 6/1995 | Oyamatsu | 438/305 |
| 5,424,234 | 6/1995 | Kwon | 438/305 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61194777 | 8/1986 | Japan . |
| 1-18762 | 1/1992 | Japan . |
| 08078672 | 3/1996 | Japan . |

OTHER PUBLICATIONS

IBM Technical Disclosure Bulletin, "Process for Making Very Small, Asymmetric, Field–Effect Transistors", vol. 30, No. 3, Aug. 1987, pp. 1136–1137 (XP 000671026), Armonk.

IBM Technical Disclosure Bulletin, "Low Series Resistance Source by Spacer Methods", vol. 33, No. 1A, Jun. 1, 1990, pp. 75–77 (XP 000120044), Armonk.

U.S. Patent Application, Serial No. 08/682,238, filed Jul. 17, 1996, entitled "Method For Fabrication Of A Non–Symmetrical Transistor", by Mark I. Gardner, Derick J. Wristers and H. Jim Fulford, Jr., pending.

*Primary Examiner*—Michael Trinh
*Attorney, Agent, or Firm*—Skjerven, Morrill, MacPherson, Franklin & Friel, LLP; David M. Sigmond

[57] ABSTRACT

A method of making N-channel and P-channel IGFETs is disclosed. The method includes, in sequence, the steps of partially doping a first source and a first drain in a first active region of a semiconductor substrate, applying a first tube anneal while a second active region of the semiconductor substrate is devoid of source/drain doping, partially doping a second source and a second drain in the second active region, applying a second tube anneal, fully doping the first source and the first drain, applying a first rapid thermal anneal, fully doping the second source and the second drain, and applying a second rapid thermal anneal. Advantageously, the first and second tube anneals provide control over the channel junction locations, and the first and second rapid thermal anneals provide rapid drive-in for subsequent source/drain doping spaced from the channel junctions.

33 Claims, 5 Drawing Sheets

U.S. PATENT DOCUMENTS

| | | | |
|---|---|---|---|
| 5,436,482 | 7/1995 | Ogoh | 257/344 |
| 5,451,807 | 9/1995 | Fujita | 257/404 |
| 5,510,279 | 4/1996 | Chien et al. | 438/305 |
| 5,512,503 | 4/1996 | Hong | 438/266 |
| 5,518,940 | 5/1996 | Hodate et al. | 438/151 |
| 5,521,417 | 5/1996 | Wada | 257/390 |
| 5,525,552 | 6/1996 | Huang | 438/297 |
| 5,547,885 | 8/1996 | Ogoh | 438/286 |
| 5,547,888 | 8/1996 | Yamazaki | 438/279 |
| 5,578,509 | 11/1996 | Fujita | 438/286 |
| 5,585,293 | 12/1996 | Sharma et al. | 438/261 |
| 5,585,658 | 12/1996 | Mukai et al. | 257/344 |
| 5,607,869 | 3/1997 | Yamazaki | 438/286 |
| 5,672,531 | 9/1997 | Gardner et al. | 438/286 |

METHOD OF MAKING N-CHANNEL AND P-CHANNEL DEVICES USING TWO TUBE ANNEALS AND TWO RAPID THERMAL ANNEALS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the channel and the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

Complementary metal-oxide semiconductor (CMOS) circuits typically include adjacent N-channel (NMOS) and P-channel (PMOS) devices. Since CMOS inverter circuits use very little power, CMOS is particularly useful in very large-scale integrated (VLSI) circuits where even small power dissipation in each transistor becomes a problem when thousands or millions of transistors are integrated on a chip. CMOS processes typically use N-well and P-well masks early in the processing sequence to define N-type and P-type active regions. CMOS processes also typically include a single masking step for forming gates over the active regions, separate masking steps for implanting lightly doped N-type source/drain regions into the P-type active region and lightly doped P-type source/drain regions into the N-type active region, formation of oxide spacers adjacent to the gates, and then separate masking steps for implanting heavily doped N-type source/drain regions into the P-type active region and heavily doped P-type source/drain regions into the N-type active region.

The diffusion characteristics of various dopants in semiconductor substrates is a complex phenomena which depends, in part, on dopant concentration, substrate (background) doping, junction depth, temperature, and the atmosphere. Unfortunately, at a given high temperature, boron tends to diffuse into the semiconductor substrate at a far greater rate than arsenic or phosphorus. For instance, at 1000° C., boron generally diffuses into silicon at least ten times faster than arsenic or phosphorus. This is partly due to the fact that the activation energy of boron (and consequently the height of the energy barrier that boron must overcome to move within the silicon lattice) is lower than that of arsenic or phosphorus. Unfortunately, the effective channel length of the N-channel device may be significantly greater than that of the P-channel device due to the rapid boron diffusion. Moreover, it becomes difficult to accurately control the channel junction locations for both the N-channel and P-channel devices.

Accordingly, a need exists for an improved method of making N-channel and P-channel devices in which the channel junction locations are relatively well controlled.

SUMMARY OF THE INVENTION

The present invention includes a method of making N-channel and P-channel devices. The method includes, in sequence, the steps of partially doping a first source and a first drain in a first active region of a semiconductor substrate, applying a first tube anneal while a second active region of the semiconductor substrate is devoid of source/drain doping, partially doping a second source and a second drain in the second active region, applying a second tube anneal, fully doping the first source and the first drain, applying a first rapid thermal anneal, fully doping the second source and the second drain, and applying a second rapid thermal anneal. Advantageously, the first and second tube anneals provide control over the channel junction locations, and the first and second rapid thermal anneals provide rapid drive-in for subsequent source/drain doping spaced from the channel junctions.

Preferably, the first tube anneal is performed at a first temperature, the second tube anneal is performed at a second temperature, the first rapid thermal anneal is performed at a third temperature, the second tube anneal is performed at fourth temperature, the first temperature exceeds the second temperature, and the third temperature exceeds the fourth temperature. As exemplary ranges, the first temperature is 825° to 875° C. maintained for 30 to 75 minutes, the second temperature is 775° to 825° C. maintained for 30 to 75 minutes, the third temperature is 950 to 1050° C. maintained for 10 to 60 seconds, and the fourth temperature is 800° to 1000° C. maintained for 10 to 60 seconds.

In accordance with another aspect of the present invention, an asymmetrical N-channel IGFET and a symmetrical P-channel IGFET are fabricated. The N-channel IGFET includes a lightly doped drain region, heavily doped source and drain regions, and an ultra-heavily doped source region, in which the heavily doped source region and the lightly doped drain region provide the channel junctions. The P-channel IGFET includes lightly doped and heavily doped source and drain regions, and the lightly doped source and drain regions provide the channel junctions. Advantageously, both IGFETs reduce hot carrier effects, and the N-channel IGFET has particularly low source-drain series resistance.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
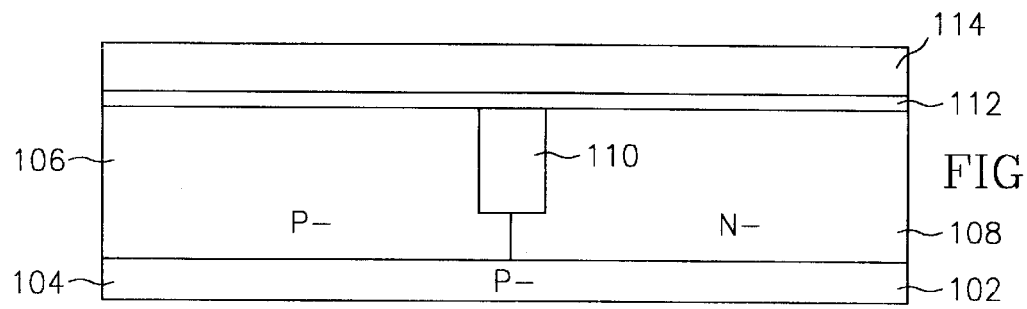
FIGS. 1A–1R show cross-sectional views of successive process steps for making N-channel and P-channel IGFETs using two tube anneals and two rapid thermal anneals in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes P-type epitaxial layer 104. Preferably, epitaxial layer 104 is disposed on a P+ base layer (not shown). Substrate 102 also includes P-active region 106 and N-active region 108 adjacent to a planar top surface. Active region 106 has a boron background concentration on the order of $1 \times 10^{16}$ atoms/cm$^3$, a <100>orientation and a resistivity of 12 ohm-cm, and active region 108 has an arsenic background concentration on the order of $1 \times 10^{16}$ atoms/cm$^3$, a <100>orientation and a resistivity of 12 ohm-cm. Trench oxide 110, composed of silicon dioxide (SiO$_2$), provides dielectric isolation between active regions 106 and 108. Gate oxide 112, composed of silicon dioxide (SiO$_2$), is formed on the top surface of substrate 102 using tube growth at a temperature of 700° to 1000° C. in an O$_2$ containing ambient. Gate oxide 112 has a thickness of 50 angstroms. Thereafter, a blanket layer of undoped polysilicon 114 is deposited by low pressure chemical vapor deposition (LPCVD) on the top surface of gate oxide 112. Polysilicon 114 has a thickness of 2000 angstroms. If desired, polysilicon 114 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 114 be doped during an implantation step following a subsequent etch step.

Figure 1B:
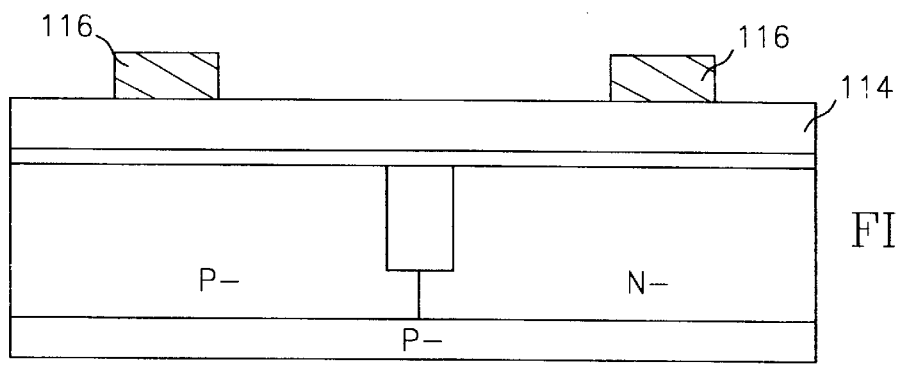

In FIG. 1B, photoresist 116 is deposited as a continuous layer on polysilicon 114 and selectively irradiated using a photolithographic system, such as a step and repeat optical projection system, in which I-line ultraviolet light from a mercury-vapor lamp is projected through a first reticle. Thereafter, photoresist 116 is developed and the irradiated portions are removed to provide openings in photoresist 116. The openings expose portions of polysilicon 114, thereby defining first and second gates.

Figure 1C:
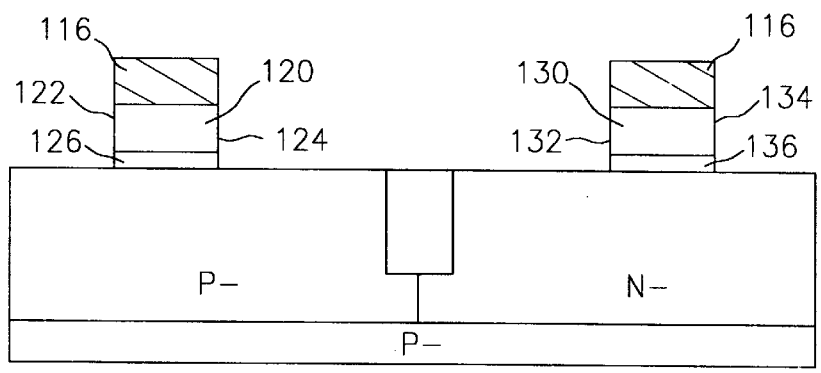

In FIG. 1C, an anisotropic etch is applied that removes the exposed portions of polysilicon 114 and the underlying portions of gate oxide 112. Preferably, a first dry etch is applied that is highly selective of polysilicon, and a second dry etch is applied that is highly selective of silicon dioxide, using photoresist 116 as an etch mask. After etching occurs, the remaining portions of polysilicon 114 and gate oxide 112 above active region 106 provide polysilicon gate 120 with opposing vertical sidewalls 122 and 124 on gate oxide 126, and polysilicon gate 130 with opposing vertical sidewalls 132 and 134 on gate oxide 136. Polysilicon gate 120 has a length (between sidewalls 122 and 124) of 3500 angstroms, and polysilicon gate 130 has a length (between sidewalls 132 and 134) of 3500 angstroms.

Figure 1D:
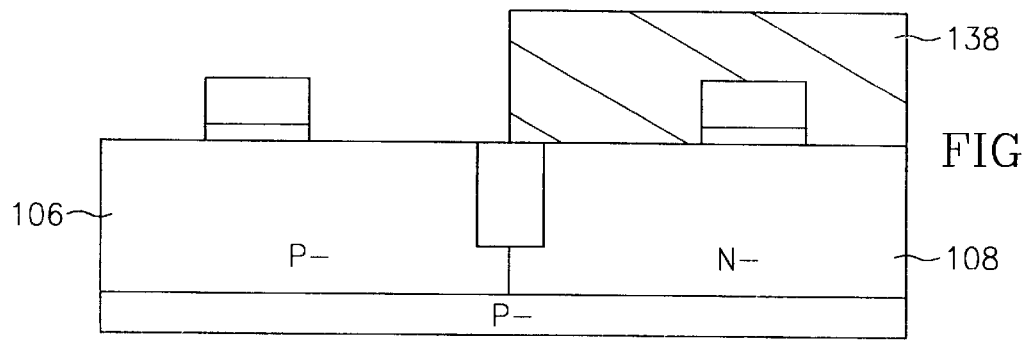

In FIG. 1D, photoresist 116 is stripped, photoresist 138 is deposited as a continuous layer over substrate 102 and selectively irradiated using the photolithographic system and a second reticle, and the irradiated portions are removed to provide an opening in photoresist 138. The opening is above active region 106, and photoresist 138 covers active region 108.

Figure 1E:
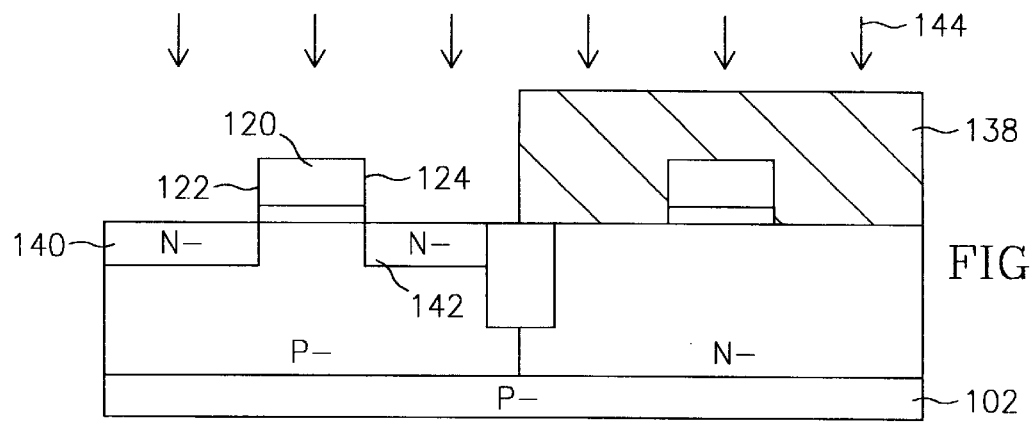

In FIG. 1E, lightly doped source and drain regions 140 and 142 are implanted into active region 106 by subjecting the structure to ion implantation of phosphorus, indicated by arrows 144, at a dose in the range of $1 \times 10^{13}$ to $5 \times 10^{14}$ atoms/cm$^2$ and an energy in the range of 2 to 35 kiloelectron-volts. Polysilicon gate 120 and photoresist 138 provide an implant mask for the underlying portion of substrate 102. As a result, lightly doped source and drain regions 140 and 142 are substantially aligned with sidewalls 122 and 124, respectively. Lightly doped source and drain regions 140 and 142 are doped N- with a phosphorus concentration in the range of about $1 \times 10^{17}$ to $5 \times 10^{18}$ atoms/cm$^3$.

Figure 1F:
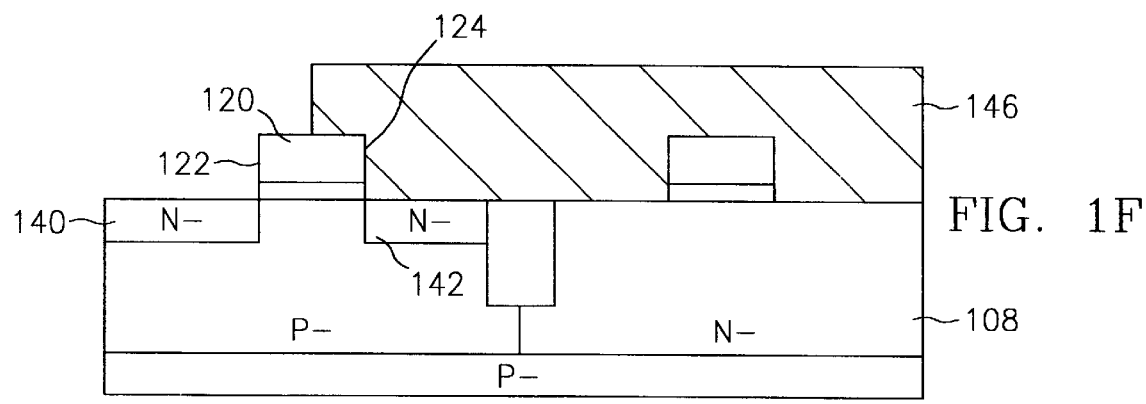

In FIG. 1F, photoresist 138 is stripped, photoresist 146 is deposited as a continuous layer over substrate 102 and selectively irradiated using the photolithographic system and a third reticle, and the irradiated portions are removed to provide an opening in photoresist 146. The opening is above lightly doped source region 140, and a first portion of polysilicon gate 120 adjacent to sidewall 122. Photoresist 146 covers lightly doped drain region 142, a second portion of polysilicon gate 120 adjacent to sidewall 124, and active region 108.

Figure 1G:
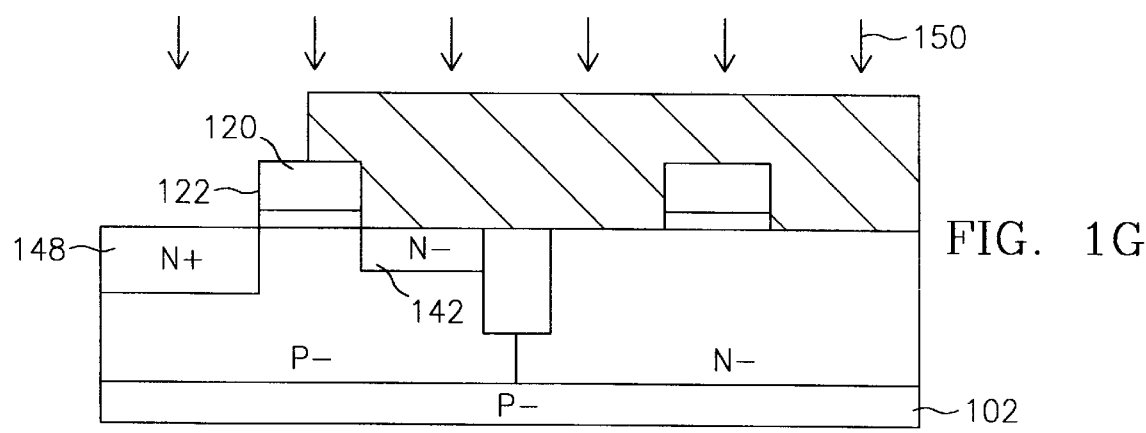

In FIG. 1G, lightly doped source region 140 is converted into heavily doped source region 148 by subjecting the structure to ion implantation of arsenic, indicated by arrows 150, at a dose of $4.5 \times 10^{15}$ atoms/cm$^2$ and an energy in the range of 10 to 80 kiloelectron-volts. Photoresist 146 and the first portion of polysilicon gate 120 (outside photoresist 146) provide an implant mask for the underlying portion of substrate 102. As a result, heavily doped source region 148 is substantially aligned with sidewall 122, and lightly doped drain region 142 is essentially unaffected. Heavily doped source region 148 is doped N+ with an arsenic concentration in the range of about $1 \times 10^{19}$ to $1 \times 10^{20}$ atoms/cm$^3$. Preferably, the dopant concentration of heavily doped source region 148 is at least 10 times that of lightly doped drain region 142.

Figure 1H:
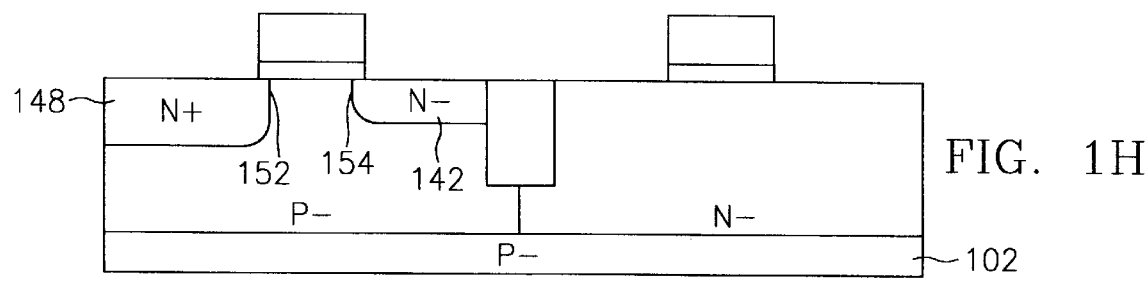

In FIG. 1H, photoresist 146 is stripped, and a first tube anneal is applied to remove crystalline damage and to drive-in and activate heavily doped source region 148 and lightly doped drain region 142. Preferably, the first tube anneal is ramped up from room temperature at about 10° C. per minute, maintained at a maximum temperature of 825° to 875° C. for 30 to 75 minutes, and then ramped down to room temperature at about 5° C. per minute. More preferably, the first tube anneal is maintained at a maximum temperature of 850° C. for 60 minutes. As a result, heavily doped source region 148 diffuses a controlled amount into substrate 102 and provides first channel junction 152 beneath polysilicon gate 120, and lightly doped drain region 142 diffuses a controlled amount into substrate 102 and provides second channel junction 154 beneath polysilicon gate 120. Of importance, active region 108 is devoid of source/drain doping during the first tube anneal.

Figure 1I:
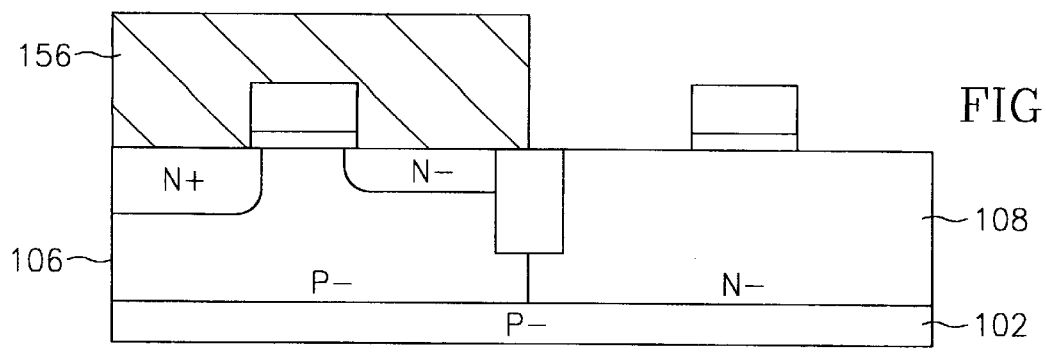

In FIG. 1I, photoresist 156 is deposited as a continuous layer over substrate 102 and selectively irradiated using the photolithographic system and a fourth reticle, and the irradiated portions are removed to provide an opening in photoresist 156. The opening is above active region 108, and photoresist 156 covers active region 106.

Figure 1J:
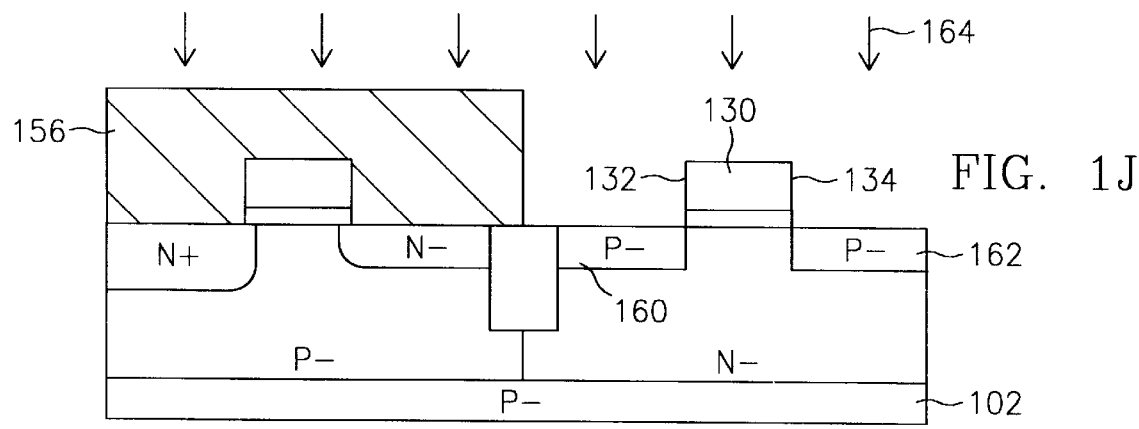

In FIG. 1J, lightly doped source and drain regions 160 and 162 are implanted into active region 108 by subjecting the structure to ion implantation of boron difluoride (BF$_2$), indicated by arrows 164, at a dose in the range of $1 \times 10^{13}$ to $5 \times 10^{14}$ atoms/cm$^2$ and an energy in the range of 2 to 35 kiloelectron-volts. Polysilicon gate 130 and photoresist 156 provide an implant mask for the underlying portion of substrate 102. As a result, lightly doped source and drain regions 160 and 162 are substantially aligned with sidewalls 132 and 134, respectively. Lightly doped source and drain regions 160 and 162 are doped P-with a boron concentration in the range of about $1 \times 10^{17}$ to $5 \times 10^{18}$ atoms/cm$^3$.

Figure 1K:
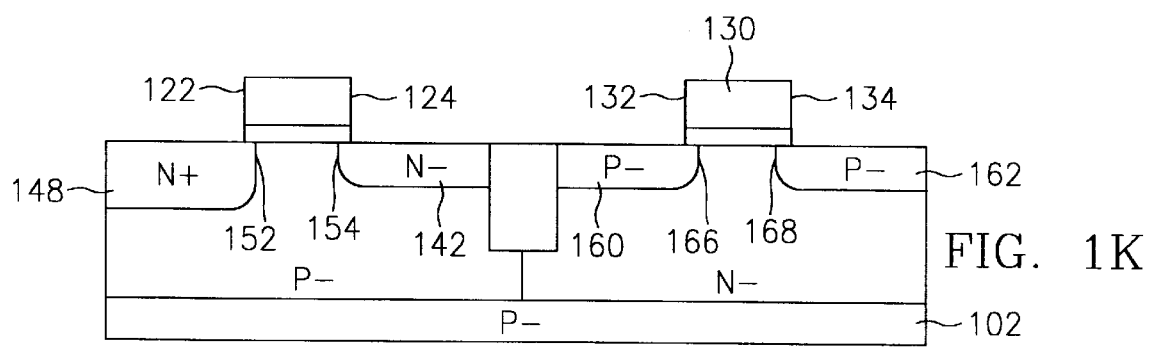

In FIG. 1K, photoresist 156 is stripped, and a second tube anneal is applied to remove crystalline damage and to drive-in and activate lightly doped source and drain regions 160 and 162. Preferably, the second tube anneal is ramped up from room temperature at about 10° C. per minute, maintained at a maximum temperature in the range of 775° to 825° C. for 30 to 75 minutes, and then ramped down to room temperature at about 5° C. per minute. More preferably, the second tube anneal is maintained at a maximum temperature of 800° C. for 60 minutes. It is also preferred that the second tube anneal have a maximum temperature that is 25° to 75° C. less than that of the first tube anneal. Accordingly, lightly doped source and drain regions 160 and 162 diffuse a controlled amount into substrate 102 and provide third and fourth channel junctions 166 and 168, respectively, beneath polysilicon gate 130. The second tube anneal also diffuses heavily doped source region 148 and lightly doped drain region 142 slightly further into substrate 102. After the first and second tube anneals, channel junction 152 laterally extends about 600 angstroms past sidewall 122, channel junction 154 laterally extends about 600 angstroms past sidewall 124, channel junction 166 laterally extends about 600 angstroms past sidewall 132, and channel junction 168 laterally extends about 600 angstroms past sidewall 134.

Figure 1L:
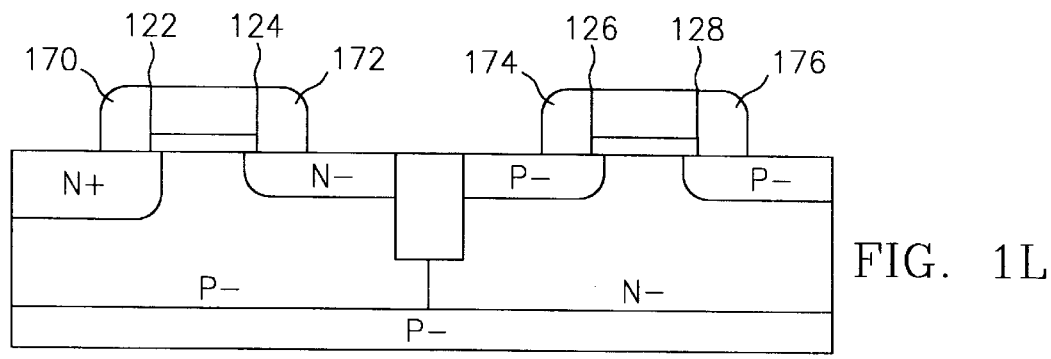

In FIG. 1L, a blanket layer of silicon dioxide with a thickness of 2500 angstroms is conformally deposited over the exposed surfaces by CVD at a temperature in the range of 300 to 400° C. Thereafter, the structure is subjected to an anisotropic etch, such as a reactive ion etch, that forms oxide spacers 170, 172, 174 and 176 adjacent to sidewalls 122, 124, 132 and 134, respectively. Oxide spacers 170, 172, 174 and 176 each extend 1200 angstroms across substrate 102.

Figure 1M:
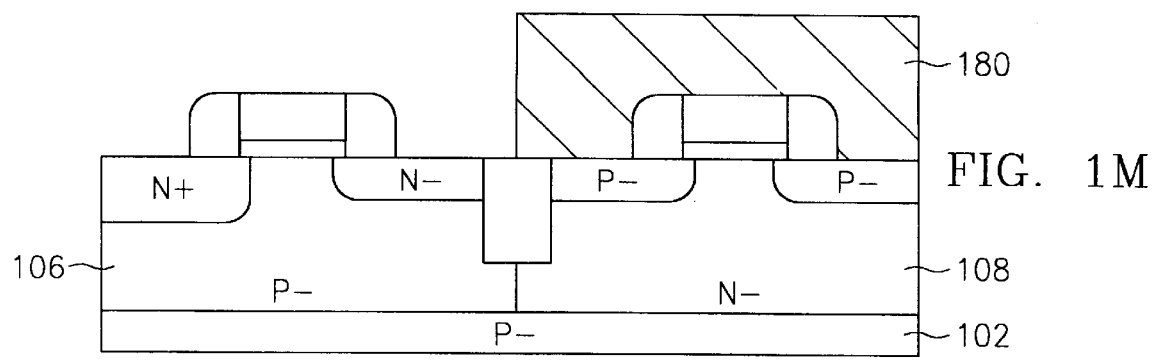

In FIG. 1M, photoresist 180 is deposited as a continuous layer over substrate 102 and selectively irradiated using the photolithographic system and the second reticle, and the irradiated portions are removed to provide an opening in photoresist 180. The opening is above active region 106, and photoresist 180 covers active region 108.

Figure 1N:
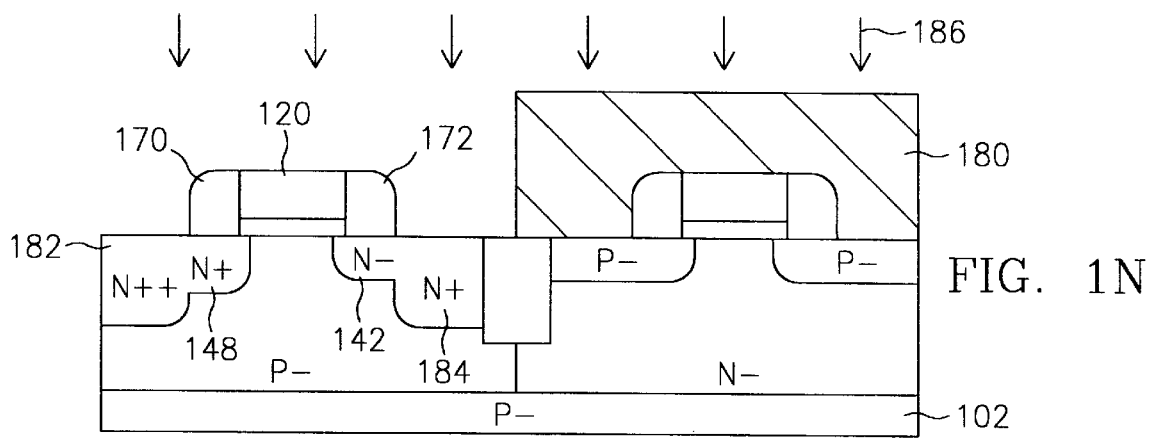

In FIG. 1N, a portion of heavily doped source region 148 outside oxide spacer 170 is converted into ultra-heavily doped source region 182, and a portion of lightly doped drain region 142 outside oxide spacer 172 is converted into heavily doped drain region 184 by subjecting the structure to ion implantation of arsenic, indicated by arrows 186, at a dose in the range of $2 \times 10^{15}$ to $3 \times 10^{15}$ atoms/cm$^2$ and an energy in the range of 20 to 80 kiloelectron-volts. Polysilicon gate 120, oxide spacers 170 and 172, and photoresist 180 provide an implant mask for the underlying portion of substrate 102. As a result, ultra-heavily doped source region 182 is substantially aligned with oxide spacer 170 on the side opposite polysilicon gate 120, and heavily doped drain region 184 is substantially aligned with oxide spacer 172 on the side opposite polysilicon gate 120. Furthermore, the portion of heavily doped source region 148 beneath oxide spacer 170 and the portion of lightly doped drain region 142 beneath oxide spacer 172 are essentially unaffected. Ultraheavily doped source region 182 is doped N++ with an arsenic concentration in the range of about $1.5 \times 10^{19}$ to $1 \times 10^{21}$ atoms/cm$^3$, and heavily doped drain region 184 is doped N+ with an arsenic concentration in the range of about $1 \times 10^{19}$ to $1 \times 10^{20}$ atoms/cm$^3$. Preferably, the dopant concentration of ultraheavily doped source region 182 is at least 1.5 times that of heavily doped source region 148 and heavily doped drain region 184.

Figure 1O:
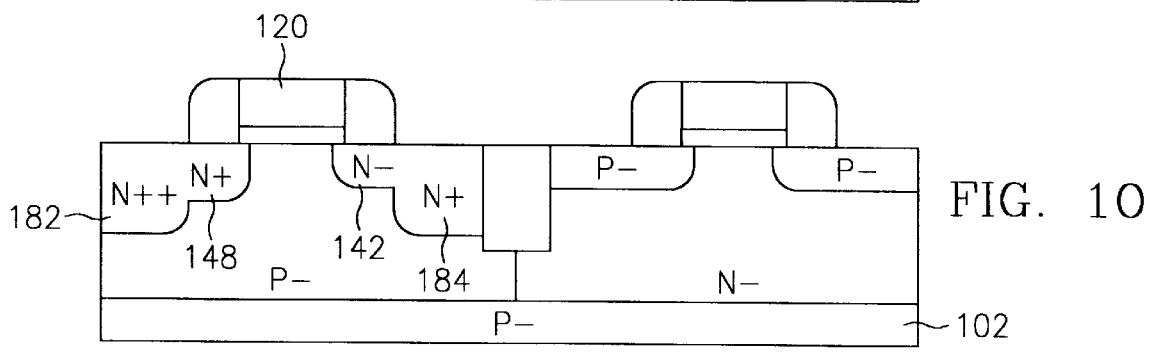

In FIG. 1O, photoresist 180 is stripped, and a first rapid thermal anneal is applied to remove crystalline damage and to drive-in and activate the implanted arsenic from the previous ion implantation. Preferably, the first rapid thermal anneal is on the order of 950° to 1050° C. for 10 to 60 seconds, and more preferably 1050° C. for 30 seconds. As a result, heavily doped source region 148 and ultra-heavily doped source region 182 merge to form a source, and lightly doped drain region 142 and heavily doped drain region 184 merge to form a drain for an NMOS device controlled by polysilicon gate 120. The first rapid thermal anneal also diffuses all of the implanted regions slightly further into substrate 102.

Figure 1P:
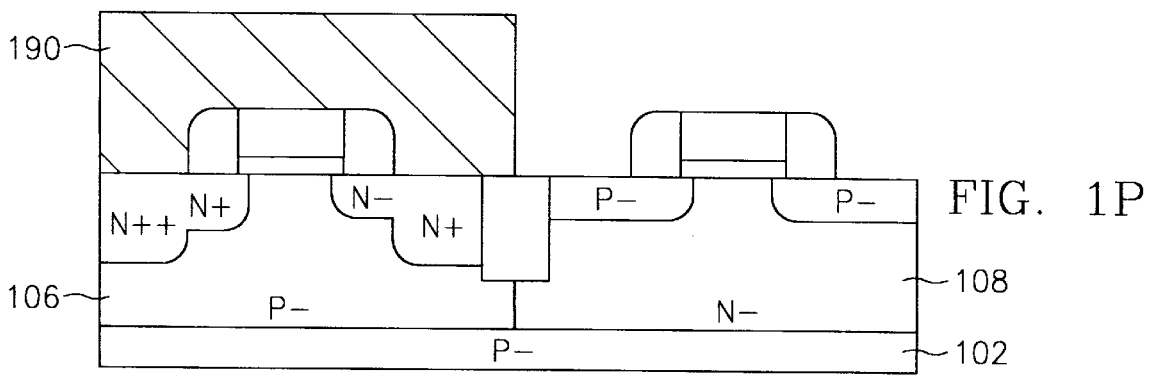

In FIG. 1P, photoresist 190 is deposited as a continuous layer over substrate 102 and selectively irradiated using the photolithographic system and the fourth reticle, and the irradiated portions are removed to provide an opening in photoresist 190. The opening is above active region 108, and photoresist 190 covers active region 106.

Figure 1Q:
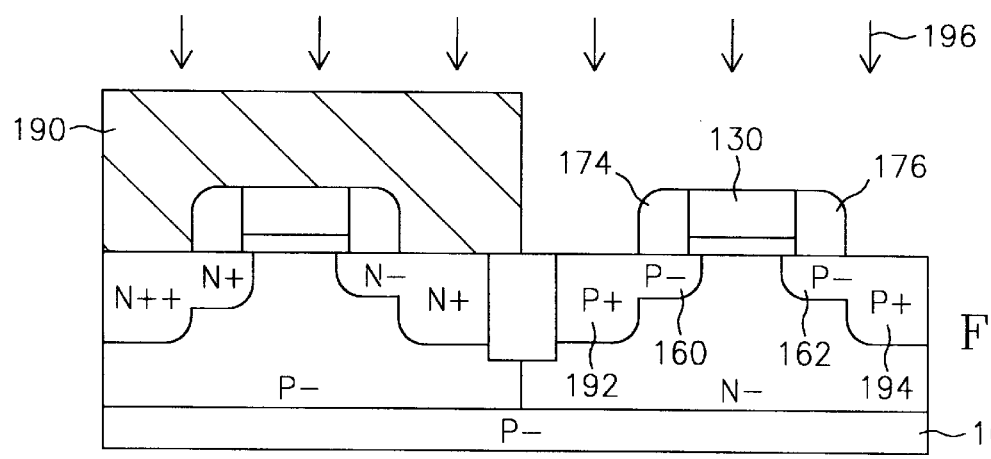

In FIG. 1Q, a portion of lightly doped source region 160 outside oxide spacer 174 is converted into heavily doped source region 192, and a portion of lightly doped drain region 162 outside oxide spacer 178 is converted into heavily doped drain region 194 by subjecting the structure to ion implantation of boron difluoride, indicated by arrows 196, at a dose in the range of $2 \times 10^{15}$ to $3 \times 10^{15}$ atoms/cm$^2$ and an energy in the range of 20 to 80 kiloelectron-volts. Polysilicon gate 130, oxide spacers 174 and 176, and photoresist 190 provide an implant mask for the underlying portion of substrate 102. As a result, heavily doped source region 192 is substantially aligned with oxide spacer 174 on the side opposite polysilicon gate 130, and heavily doped drain region 194 is substantially aligned with oxide spacer 176 on the side opposite polysilicon gate 130.

Furthermore, the portion of lightly doped source region 160 beneath oxide spacer 174 and the portion of lightly doped drain region 162 beneath oxide spacer 176 are essentially unaffected. Heavily doped source and drain regions 192 and 194 are doped P+ with a boron concentration in the range of about $1 \times 10^{19}$ to $1 \times 10^{20}$ atoms/cm$^3$. Preferably, the dopant concentration of heavily doped source and drain regions 192 and 194 is at least 10 times that of lightly doped source and drain regions 160 and 162.

Figure 1R:
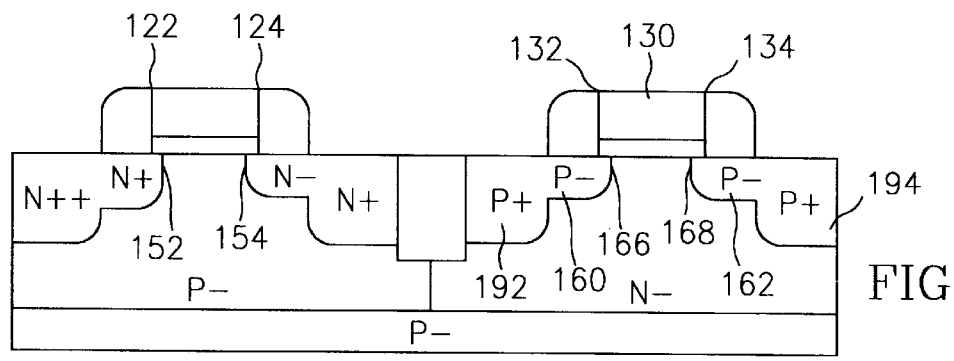

In FIG. 1R, photoresist 194 is stripped, and a second rapid thermal is applied to remove crystalline damage and to drive-in and activate the implanted boron from the previous ion implantation. Preferably, the second rapid thermal anneal is on the order of 800° to 1000° C. for 10 to 60 seconds, and more preferably 1000° C. for 30 seconds. It is also preferred that the second rapid thermal anneal have a temperature that is 50° to 200° C. less than that of the first rapid thermal anneal. Accordingly, lightly doped source region 160 and heavily doped source region 192 merge to form a source, and lightly doped drain region 162 and heavily doped drain region 194 merge to form a drain for a PMOS device controlled by polysilicon gate 130. The second rapid thermal anneal also diffuses all of the implanted regions slightly further into substrate 102. After the first and second rapid thermal anneals, channel junction 152 laterally extends about 850 angstroms past sidewall 122, channel junction 154 laterally extends about 850 angstroms past sidewall 124, channel junction 166 laterally extends about 850 angstroms past sidewall 132, and channel junction 168 laterally extends about 850 angstroms past sidewall 134. Thus, channel junctions 152 and 154 provide an effective channel length of about 1800 angstroms, and channel junctions 166 and 168 provide an effective channel length of about 1800 angstroms.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the interconnect metallization. These further processing steps are conventional and need not be repeated herein.

Likewise the principal processing steps disclosed herein may be combined with other steps apparent to those skilled in the art.

At completion of the process, the amount of overlap between the gate and the source and drain is a matter of design choice. Increasing the overlap increases capacitive effects (known as "Miller capacitance") that tend to reduce switching speeds, however increasing the overlap also decreases the channel length which tends to increase drive current. Therefore, the overlap between the gate and the source and drain involves a tradeoff between switching speed and drive current. Advantageously, the present invention is well-suited for tailoring the drive current ratio between the N-channel and P-channel devices.

The present invention includes numerous variations to the embodiment described above.

For instance, the N-type source may include a very small lightly doped N-type source region adjacent to the channel junction. If desired, the first spacer can be removed so that substantially all of the heavily doped N-type source region is converted into the ultra-heavily doped N-type source region. The spacers may include several layers of sequentially grown or deposited materials, of which only one layer need be subjected to the anisotropic etch. The gate can be various conductors, and the gate insulators and spacers and can be various dielectrics including silicon dioxide, silicon nitride and silicon oxynitride.

Moreover, both the N-channel and P-channel IGFETs can be symmetrical or asymmetrical. For instance, an asymmetrical P-channel device may include a lightly doped drain region, heavily doped source and drain regions, and an ultra-heavily doped source region, with the heavily doped source region and lightly doped drain region providing channel junctions. Likewise, a symmetrical N-channel device may include lightly and heavily doped source and drain regions in which the lightly doped source and drain regions provide channel junctions. Suitable N-type dopants include arsenic, phosphorus and combinations thereof; suitable P-type dopants include boron, boron species (such as boron difluoride) and combinations thereof.

The invention is particularly well-suited for fabricating N-channel MOSFETs, P-channel MOSFETs, and other types of IGFETs, as well as CMOS structures such as inverter circuits, particularly for high-performance microprocessors where high circuit density is essential. Although only a single pair of N-channel and P-channel devices has been shown for purposes of illustration, it is understood that in actual practice, many devices are fabricated on a single semiconductor wafer as widely practiced in the art. Accordingly, the invention is well-suited for use in integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel IGFETs, comprising the following steps in the sequence set forth:

partially doping a first source and a first drain in a first active region of a semiconductor substrate;

applying a first tube anneal while a second active region of the semiconductor substrate is devoid of source/drain doping;

partially doping a second source and a second drain in the second active region;

applying a second tube anneal;

fully doping the first source and the first drain;

applying a first rapid thermal anneal;

fully doping the second source and the second drain; and applying a second rapid thermal anneal.

2. The method of claim 1, wherein:

partially doping the first source and the first drain includes implanting first lightly doped source and drain regions into the first active region; and partially doping the second source and the second drain includes implanting second lightly doped source and drain regions into the second active region.

3. The method of claim 2, wherein:

partially doping the first source and the first drain includes converting at least a portion of the first lightly doped source region into a first heavily doped source region; and fully doping the first source and the first drain includes converting at least a portion of the first heavily doped source region into a first ultra-heavily doped source region, and converting a portion of the first lightly doped drain region into a first heavily doped drain region.

4. The method of claim 3, wherein partially doping the first source and the first drain includes converting substantially all of the first lightly doped source region into the first heavily doped source region without doping the first lightly doped drain region.

5. The method of claim 3, wherein fully doping the first source and the first drain includes converting substantially all of the first heavily doped source region into the first ultra-heavily doped source region.

6. The method of claim 3, wherein fully doping the second source and the second drain includes converting a portion of the second lightly doped source region into a second heavily doped source region, and converting a portion of the second lightly doped drain region into a second heavily doped drain region.

7. The method of claim 1, wherein the N-channel IGFET includes the first source and the first drain, and the P-channel IGFET includes the second source and the second drain.

8. The method of claim 7, wherein the N-channel and P-channel IGFETs are both symmetrical.

9. The method of claim 7, wherein the N-channel and P-channel IGFETs are both asymmetrical.

10. The method of claim 7, wherein the N-channel IGFET is asymmetrical and the P-channel IGFET is symmetrical.

11. The method of claim 1, wherein:

the first tube anneal is performed at a first temperature;

the second tube anneal is performed at a second temperature;

the first rapid thermal anneal is performed at a third temperature;

the second rapid thermal anneal is performed at a fourth temperature;

the first temperature exceeds the second temperature, and the third temperature exceeds the fourth temperature.

12. The method of claim 11, wherein:

the first temperature exceeds the second temperature by at least 50° C.; and the third temperature exceeds the fourth temperature by at least 50° C.

13. The method of claim 11, wherein:

the first temperature is in the range of 825° to 875° C.; and the second temperature is in the range of 775° to 825° C.

14. The method of claim 11, wherein the third temperature is in the range of 950° to 1050° C.; and the fourth temperature is in the range of 800° to 1000° C.

15. The method of claim 11, wherein:

the first temperature is maintained in the range of 30 to 75 minutes;

the second temperature is maintained in the range of 30 to 75 minutes;

the third temperature is maintained in the range of 10 to 60 seconds; and the fourth temperature is maintained in the range of 10 to 60 seconds.

16. The method of claim 1, wherein the first and second active regions are adjacent to an isolation region in the substrate.

17. The method of claim 1, wherein the N-channel and P-channel IGFETs provide an inverter circuit.

18. A method of making N-channel and P-channel IGFETs, comprising the following steps in the sequence set forth:

providing a semiconductor substrate with a P-type active region and an N-type active region;

providing a first gate with first and second opposing sidewalls over the P-type active region, and a second gate with third and fourth opposing sidewalls over the N-type active region;

implanting a first N-type dopant to provide lightly doped N-type source and drain regions in the P-type active region;

applying a first tube anneal at a first temperature to drive-in the first N-type dopant while the N-type active region is devoid of source/drain doping;

implanting a first P-type dopant to provide lightly doped P-type source and drain regions in the N-type active region;

applying a second tube anneal at a second temperature, less than the first temperature, to drive-in the first P-type dopant;

implanting a second N-type dopant to provide a heavily doped N-type drain region in the P-type active region;

applying a first rapid thermal anneal at a third temperature to drive-in the second N-type dopant and form an N-type source and drain in the P-type active region;

implanting a second P-type dopant to provide a heavily doped P-type drain region in the N-type active region; and applying a second rapid thermal anneal at a fourth temperature, less than the third temperature, to drive-in the second P-type dopant and form a P-type source and drain in the N-type active region.

19. The method of claim 18, wherein:

implanting the second N-type dopant provides a heavily doped N-type source region in the P-type active area; and implanting the second P-type dopant provides a heavily doped P-type source region in the N-type active area.

20. The method of claim 18, including:

implanting a third N-type dopant to convert substantially all of the lightly doped N-type source region into a heavily doped N-type source region without doping the lightly doped N-type drain region;

applying the first tube anneal to drive-in the first and third N-type dopants;

forming first and second spacers adjacent to the first and second sidewalls, respectively; and implanting the second N-type dopant to convert a portion of the heavily doped N-type source region outside the first spacer into an ultra-heavily doped N-type source region, and to convert a portion of the lightly doped N-type drain region outside the second spacer into a heavily doped N-type drain region.

21. The method of claim 20, wherein:

the N-type source includes the heavily doped and ultra-heavily doped N-type source regions, the heavily doped N-type source region provides a first channel junction and the ultra-heavily doped N-type source region is spaced from the first channel junction; and the N-type drain includes the lightly and heavily doped N-type drain regions, the lightly doped N-type drain region provides a second channel junction and the heavily doped N-type drain region is spaced from the second channel junction.

22. The method of claim 21, including:

forming third and fourth spacers adjacent to the third and fourth sidewalls, respectively; and implanting the second P-type dopant to convert a portion of the lightly doped P-type source region outside the third spacer into a heavily doped P-type source region, and to convert a portion of the lightly doped P-type drain region outside the fourth spacer into the heavily doped P-type drain region.

23. The method of claim 18, wherein:

the first temperature exceeds the second temperature by at least 50° C.; and the third temperature exceeds the fourth temperature by at least 50° C.

24. The method of claim 18, wherein:

the first temperature is in the range of 825° to 875° C. and is maintained in the range of 30 to 75 minutes;

the second temperature is in the range of 775° to 825° C. is maintained in the range of 30 to 75 minutes;

the third temperature is in the range of 950° to 1050° C. and is maintained in the range of 10 to 60 seconds; and the fourth temperature is in the range of 800° to 1000° C. and is maintained in the range of 10 to 60 seconds.

25. The method of claim 18, wherein the N-type active region and the P-type active region are adjacent to an isolation region in the substrate.

26. The method of claim 18, wherein the N-channel and P-channel IGFETs provide an inverter circuit.

27. The method of claim 18, wherein:
the first and second N-type dopants are each selected from the group consisting of arsenic, phosphorus, and combinations thereof, and
the first and second P-type dopants are each selected from the group consisting of boron, boron species and combinations thereof.

28. A method of making an asymmetrical N-channel IGFET and a symmetrical P-channel IGFET using two tube anneals and two rapid thermal anneals, comprising the steps of:
providing a semiconductor substrate with a P-type active region and an N-type active region;
forming a first gate insulator on the P-type active region;
forming a second gate insulator on the N-type active region;
forming a first gate with first and second opposing sidewalls on the first gate insulator;
forming a second gate with third and fourth opposing sidewalls on the second gate insulator; then
implanting a first N-type dopant to form lightly doped N-type source and drain regions in the P-type active region and substantially aligned with the first and second sidewalls, respectively;
implanting a second N-type dopant to convert substantially all of the lightly doped N-type source region into a heavily doped N-type source region without doping the lightly doped N-type drain region; then
applying a first tube anneal at a first temperature to drive-in the first and second N-type dopants while the N-type active region is devoid of source/drain doping; then
implanting a first P-type dopant to form lightly doped P-type source and drain regions in the N-type active region and substantially aligned with the third and fourth sidewalls, respectively; then
applying a second tube anneal at a second temperature, less than the first temperature, to drive-in the first P-type dopant;
forming first, second, third and fourth spacers adjacent to the first, second, third and fourth sidewalls, respectively; then
implanting a third N-type dopant to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer; then
applying a first rapid thermal anneal at a third temperature to drive-in the third N-type dopant and form an N-type source and drain in the P-type active region, wherein the N-type source includes the heavily doped and ultra-heavily doped N-type source regions, and the N-type drain includes the lightly doped and heavily doped N-type drain regions; then
implanting a second P-type dopant to convert a portion of the lightly doped P-type source region outside the third spacer into a heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer; and then
applying a second rapid thermal anneal at a fourth temperature, less than the third temperature, to drive-in the second P-type dopant and form a P-type source and drain in the N-type active region, wherein the P-type source includes the lightly doped and heavily doped P-type source regions, and the P-type drain includes the lightly doped and heavily doped P-type drain regions.

29. The method of claim 28, wherein:
a dopant concentration of the heavily doped N-type source and drain regions is at least 10 times that of the lightly doped N-type drain region; and
a dopant concentration of the ultra-heavily doped N-type source region is at least 1.5 times that of the heavily doped N-type source and drain regions.

30. The method of claim 29, wherein:
the dopant concentration of the lightly doped N-type drain region is in the range of about $1 \times 10^{17}$ to $5 \times 10^{18}$ atoms/cm$^3$;
the dopant concentration of the heavily doped N-type source and drain regions is in the range of about $1 \times 10^{19}$ to $5 \times 10^{18}$ atoms/cm$^3$; and
the dopant concentration of the ultra-heavily doped N-type source region is in the range about $1.5 \times 10^{19}$ to $1 \times 10^{21}$ atoms/cm$^3$.

31. The method of claim 28, wherein:
the heavily doped N-type source region provides a first channel junction spaced from the ultra-heavily doped N-type source region;
the lightly doped N-type source region provides a second channel junction spaced from the heavily doped N-type drain region;
the lightly doped P-type source region provides a third channel junction spaced from the heavily doped P-type source region; and
the lightly doped P-type drain region provides a fourth channel junction spaced from the heavily doped P-type drain region.

32. The method of claim 28, wherein forming the first, second, third and fourth spacers includes depositing a blanket layer of silicon dioxide over the substrate, and then applying a reactive ion etch.

33. The method of claim 28, wherein the first and second gates are polysilicon, the first and second gate insulators are silicon dioxide, and the spacers are silicon dioxide.

* * * * *